United States Patent
Kim et al.

(10) Patent No.: US 8,952,265 B2
(45) Date of Patent: Feb. 10, 2015

(54) ELECTROMAGNETIC INTERFERENCE NOISE REDUCTION PACKAGE BOARD

(75) Inventors: Han Kim, Suwon-si (KR); Dae-Hyun Park, Suwon-si (KR); Young-Min Ban, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 241 days.

(21) Appl. No.: 13/590,760

(22) Filed: Aug. 21, 2012

(65) Prior Publication Data

US 2013/0048365 A1 Feb. 28, 2013

(30) Foreign Application Priority Data

Aug. 22, 2011 (KR) .................... 10-2011-0083674

(51) Int. Cl.
*H05K 1/11* (2006.01)
*H01L 23/64* (2006.01)
*H01L 23/552* (2006.01)
*H05K 1/02* (2006.01)
*H01L 23/66* (2006.01)

(52) U.S. Cl.
CPC .............. *H01L 23/64* (2013.01); *H01L 23/552* (2013.01); *H05K 1/0236* (2013.01); *H05K 1/0224* (2013.01); *H01L 23/66* (2013.01); *H01L 2224/16225* (2013.01); *H01L 2224/48091* (2013.01); *H01L 2224/48227* (2013.01)
USPC .......................................... 174/262; 361/792

(58) Field of Classification Search
CPC .. H05K 1/0224; H05K 1/0225; H05K 1/0227
USPC ................ 174/262–266; 361/792–795
See application file for complete search history.

(56) References Cited

U.S. PATENT DOCUMENTS 5,376,759 A * 12/1994 Marx et al. .................... 174/255
8,218,337 B2 * 7/2012 Choudhury et al. .......... 361/818

FOREIGN PATENT DOCUMENTS

KR   10-1021552   3/2011
KR   10-1055492   8/2011

OTHER PUBLICATIONS

Korean Office Action issued Aug. 27, 2012 in corresponding Korean Patent Application No. 10-2011-0083674.

* cited by examiner

*Primary Examiner* — Jeremy C Norris

(57) ABSTRACT

An EMI noise reduction package board, having a top layer and a bottom layer, one of which having a semiconductor device mounted thereon, can include: a first area having a signal layer arranged on one surface thereof; and a second area placed on a lateral side of the first area and having unit structures arranged repeatedly therein, the unit structures configured for inhibiting EMI noise from being radiated to an outside through the lateral side of the first area. The unit structure can include: a top conductive plate and a bottom conductive plate, formed, respectively, on the top layer and the bottom layer of the second area to face each other in a pair; and a via, connecting the top conductive plate with the bottom conductive plate.

3 Claims, 4 Drawing Sheets

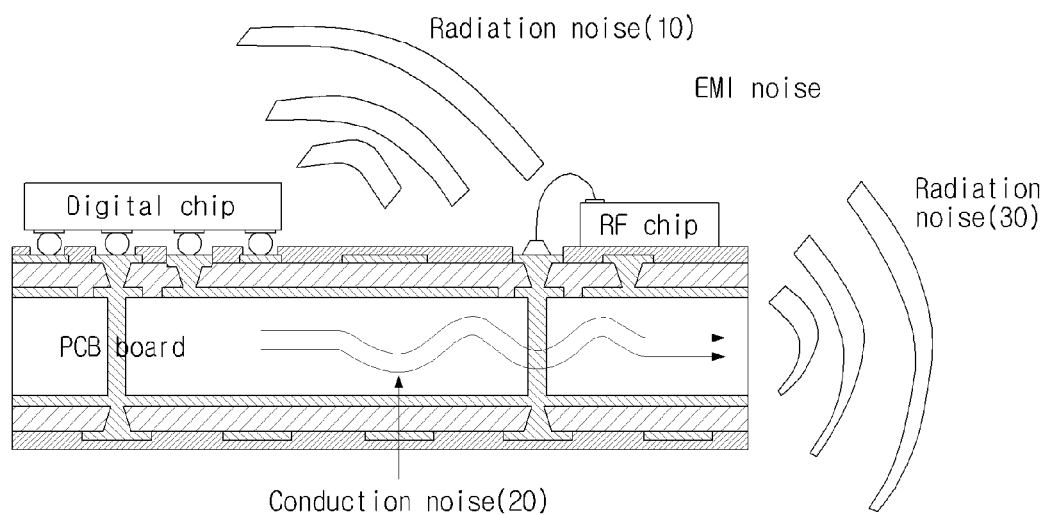
FIG. 1
PRIOR ART
FIG. 2
PRIOR ART

ELECTROMAGNETIC INTERFERENCE NOISE REDUCTION PACKAGE BOARD

CROSS-REFERENCE TO RELATED APPLICATIONS

This application claims the benefit of Korean Patent Application No. 10-2011-0083674, filed with the Korean Intellectual Property Office on Aug. 22, 2011, the disclosure of which is incorporated herein by reference in its entirety.

BACKGROUND

1. Technical Field

The present invention relates to a board, more specifically to a noise reduction board that can reduce electromagnetic interference noise by use of an electromagnetic bandgap structure.

2. Background Art

As the operating frequencies of electronic products become higher, electromagnetic interference (EMI) has become a chronic noise problem. Particularly, as the recent electronic products are operated in a double-digit MHz to a few GHz, the EMI problem has become increasingly serious, making it urgent to find a solution. Among the EMI problems in a board, there have been few studies targeted for the noise occurred at an edge of the board, limiting the ability to shield the noise completely on the board.

An EMI noise refers to a noise that causes a noise problem generated by interference when electromagnetic waves generated in one electronic circuit, device or part is transferred to another electronic circuit, device or part. The EMI noise can be mainly classified into a radiation noise (see reference numerals 10 and 30 in FIG. 1) and a conduction noise (see reference numeral 20 in FIG. 1).

In the case of the radiation noise 10 that is radiated through an upper part of the board (i.e., a surface on which an electronic part is mounted), the noise problem is commonly solved by shielding the upper part of the board with an electromagnetic shielding cap, such as a metal cap. However, there have been insufficient studies for an effective solution for the radiation noise 30 (simply referred to as "edge noise"), which is the conduction noise 20 flowing through the inside of the board that is conducted to an edge of the board and radiated to the outside of the board.

FIG. 2 shows a briefly-modeled package board to show how the EMI noise is radiated, wherein the distributed dots indicate the spatial distribution of the intensity of E-field. It can be seen that the E-field is freely radiated through the edge of the board.

If it becomes possible to reduce the edge noise at the edge of a board by simply modifying the structure of the board, it is expected to dramatically save the development time and cost from the conventional solution using the metal cap or circuit. Moreover, it would be more advantageous in terms of spatial utilization or power consumption, and the noise in the frequency band above several GHz would be also removed easily, thereby effectively solving the EMI noise problem at the edge of the board.

SUMMARY

The present invention provides an EMI noise reduction package board that can shield radiation noise radiated at an edge of the board, by inserting an electromagnetic bandgap structure that can shield the noise in a particular frequency band into the edge of the board.

The present invention provides an EMI noise reduction package board that has advantages in terms of spatial utilization, manufacturing cost and power consumption because radiation noise radiated at an edge of the board can be easily shielded by a simple structural change of the board.

The present invention discloses an EMI noise reduction package board. The EMI noise reduction package board in accordance with an embodiment of the present invention, which has a top layer and a bottom layer, one of which having a semiconductor device mounted thereon, can include: a first area having a signal layer arranged on one surface thereof; and a second area placed on a lateral side of the first area and having a plurality of unit structures arranged repeatedly therein, the unit structures configured for inhibiting EMI noise from being radiated to an outside through the lateral side of the first area.

The unit structure can include: a top conductive plate and a bottom conductive plate, which are formed, respectively, on the top layer and the bottom layer of the second area to face each other in a pair; and a via, which connects the top conductive plate with the bottom conductive plate, and the top conductive plate or the bottom conductive plate of adjacent unit structures can be electrically connected with each other through a connection line.

The connection line can be repeatedly formed along an upper part of the lateral side and a lower part of the lateral side of the first area.

A ground layer can be formed on the bottom layer of the first area, and the bottom conductive plate can be electrically connected with the ground layer.

The unit structures can be formed to surround the first area entirely.

BRIEF DESCRIPTION OF THE DRAWINGS

FIG. 1 shows how noise is radiated in a printed circuit board in which an electronic device is mounted.

FIG. 2 shows how EMI noise is radiated from a conventional package board.

DETAILED DESCRIPTION

Figure 3:
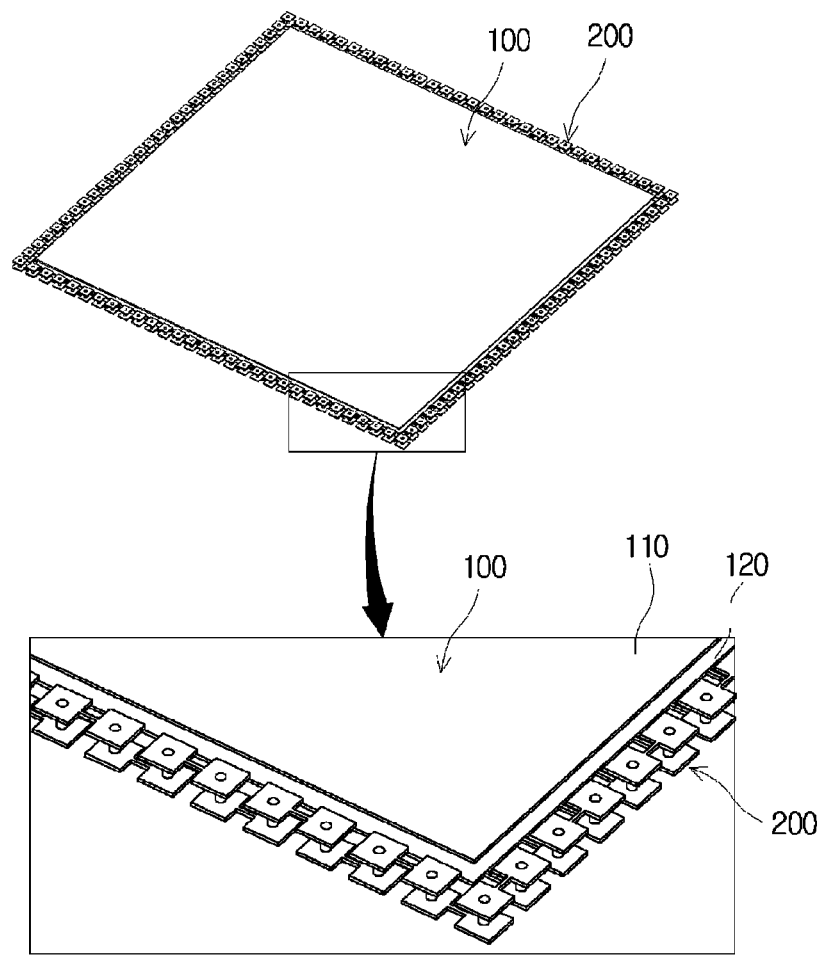
FIG. 3 shows an EMI noise reduction package board in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention.

Throughout the description of the present invention, when describing a certain technology is determined to evade the point of the present invention, the pertinent detailed description will be omitted. Numerals (e.g., first, second, etc.) used in the description of the present invention are only for distinguishing one element from another element.

Hereinafter, an EMI noise reduction package board in accordance with an embodiment of the present invention will be described in detail with reference to the accompanying drawings. Identical or corresponding elements will be given the same reference numerals, regardless of the figure number, and any redundant description of the identical or corresponding elements will not be repeated.

The EMI noise reduction package board in accordance with the present invention aims to prevent radiation noise inside the board from being conducted to an edge portion of the board and radiated out of the board (i.e., to shield edge noise). For this, as shown in FIG. 3 and FIG. 4, the package board in accordance with the present embodiment includes a first area 100, which has a signal layer arranged on one or both layers thereof, and a second area 200, which has a plurality of unit structures 210 arranged repeatedly on a lateral side of the first area 100 to shield EMI noise radiated to an outside through the lateral side of the first area 100.

The first area 100 has a top layer 110 and a bottom layer 120, and the signal layer can be formed on one or both of the top layer 110 and the bottom layer 120. Although it is illustrated in FIG. 3 that the signal layer is formed on the top layer 110 only and a ground layer is formed on the bottom layer 120, it shall be appreciated that the present invention is not restricted to this structure. An insulator or dielectric is interposed between the top layer 110 and the bottom layer 120.

Figure 4:
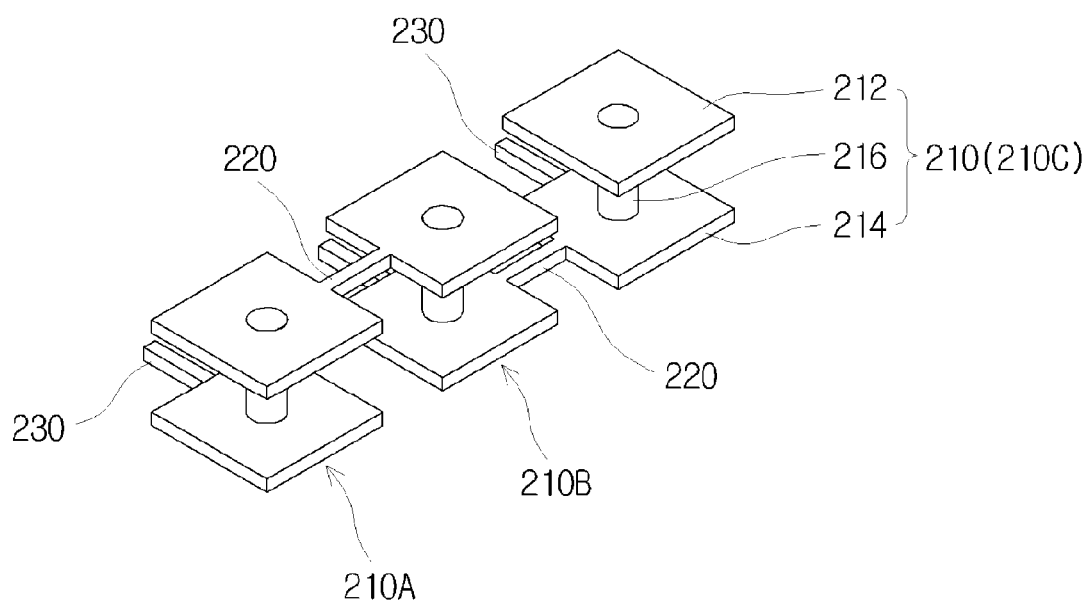
FIG. 4 is a magnified perspective view of unit structures shown in FIG. 3.

As shown in FIG. 3 and FIG. 4, the second area 200 placed on the lateral side of the first area 100 has the unit structures 210, which are for inhibiting the EMI noise from being radiated, arranged repeatedly therein. More specifically, the unit structure 210 includes a top conductive plate 212 and a bottom conductive plate 214, which are formed, respectively, on the top layer 110 and the bottom layer 120 of the second area 200 to face each other in a pair, and a via 216, which connects the top conductive plate 212 with the bottom conductive plate 214. The top conductive plates 212 or the bottom conductive plates 214 of adjacent unit structures 210 are electrically connected with each other through a connection line 220.

Here, the top conductive plate 212 and the bottom conductive plate 214 do not refer to conductive plates that are configured to perform specific functions. Rather, the top conductive plate 212 and the bottom conductive plate 214 are named as such in order to merely distinguish conductive plates that are arranged on different planes. Although the conductive plates can have a same size and a same shape, it is also possible that the conductive plates have different sizes and shapes, as required by design. Moreover, an insulator or dielectric is interposed between the top conductive plate 212 and the bottom conductive plate 214 for interlayer insulation.

Here, as shown in FIGS. 3 and 4, the connection line 220 can be repeatedly formed along an upper part of the lateral side and a lower part of the lateral side of the first area 100. That is, in the case that a center unit structure 210B shown in FIG. 4 is electrically connected with a preceding unit structure 210A through the top conductive plate 213, the center unit structure 210A can be electrically connected with a following unit structure 210C through the bottom conductive plate 214. Such a top/bottom repetition structure can be applied throughout the entire package board. In other words, the unit structures 210 formed in the second area 200 can be formed to surround the first area 100 entirely. Such a structure in which the unit structures 210 are repeatedly formed is referred to as a Daisy chain structure.

Figure 5:
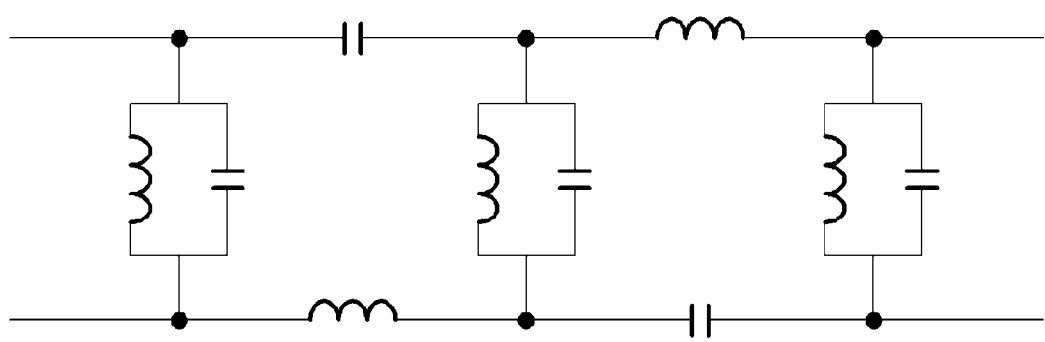
FIG. 5 is an equivalent circuit schematic diagram of the unit structure shown in FIG. 4.

FIG. 4 is a magnified perspective view of the unit structures 210 shown in FIG. 3, and FIG. 5 is an equivalent circuit schematic diagram of the unit structures 210 shown in FIG. 4. As shown in FIG. 5, the conductive plates 212, 214 form capacitance together with the dielectric interposed therebetween, and the via 216 forms inductance. By combining these capacitance and inductance, an EBG structure, i.e., an L-C filter, for shielding the noise is formed. More specifically, an L component and a C component are serially arranged in a horizontal direction to function as bandpass filtering, and the L component and the C component are arranged in parallel in a vertical direction to function as bandstop filtering.

In the case that a ground layer is formed on the bottom layer 120 of the first area 100, the bottom conductive plate 214 can be electrically connected with the ground layer. That is, as shown in FIG. 3 and FIG. 4, the bottom conductive plate 214 can be in contact with the ground layer formed on the bottom layer 120 of the first area 100 by an access line 230. By having the bottom conductive plate 214 connected with the ground layer as described above, a more wide ground can be provided to improve the noise shielding effect. However, the present invention is restricted to this structure, and it is also possible to have a structure in which the top conductive plate 212 and the bottom conductive plate 214 are electrically separated from the first area 100 in the case that the signal layer is formed on both the top layer 110 and the bottom layer 120 of the first area 100.

Figure 6:
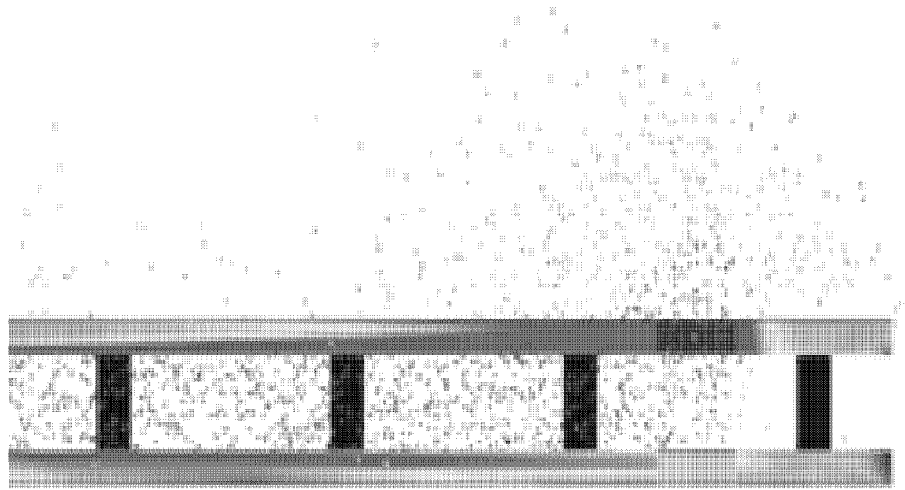
FIG. 6 shows how EMI noise is radiated from the EMI noise reduction package board in accordance with an embodiment of the present invention.

Illustrated in FIG. 6 is a result of simulation for checking whether the Daisy chain structure suggested in the present embodiment can inhibit the EMI noise from being radiated at the edge of the package board. The distribution shown in FIG. 6 indicates spatial distribution of the E-field, and as it can be seen in the result, the E-field at the edge of the board is inhibited by the suggested structure.

While the present invention has been described with reference to a certain embodiment, the embodiment is for illustrative purposes only and shall not limit the invention. It is to be appreciated that those skilled in the art can change or modify the embodiment without departing from the scope and spirit of the invention.

It shall be also appreciated that a very large number of embodiments other than that described herein are possible within the scope of the present invention, which shall be defined by the claims appended below.

What is claimed is:

1. An EMI noise reduction package board having a top layer and a bottom layer, one of which having a semiconductor device mounted thereon, the EMI noise reduction package board comprising:

a first area having a signal layer arranged on one surface thereof; and a second area placed on a lateral side of the first area and having a plurality of unit structures arranged repeatedly therein, the unit structures configured for inhibiting EMI noise from being radiated to an outside through the lateral side of the first area, wherein the unit structure comprises: a top conductive plate and a bottom conductive plate, which are formed, respectively, on the top layer and the bottom layer of the second area to face each other in a pair; and a via, which connects the top conductive plate with the bottom conductive plate, and wherein the top conductive plate or the bottom conductive plate of one of the unit structures is electrically connected with the top conductive plate or the bottom conductive plate, respectively, of another of the unit structures that is adjacent to the one of the unit structures through a connection line, and wherein the connection line is repeatedly formed along an upper part of the lateral side and a lower part of the lateral side of the first area.

2. The EMI noise reduction package board of claim 1, wherein a ground layer is formed on the bottom layer of the first area, and wherein the bottom conductive plate is electrically connected with the ground layer.

3. The EMI noise reduction package board of claim 1, wherein the unit structures are formed to surround the first area entirely.

* * * * *